United States Patent
Chen et al.

(10) Patent No.: US 10,530,323 B2
(45) Date of Patent: Jan. 7, 2020

(54) METHODS AND APPARATUS OF ADJUSTING DELAYS OF SIGNALS

(71) Applicant: HUAWEI TECHNOLOGIES CO., LTD., Shenzhen, Guangdong (CN)

(72) Inventors: Fei Chen, Montreal (CA); Robert Morawski, Montreal (CA); Tho Le-Ngoc, Montreal (CA); James Gary Griffiths, Braeside (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 54 days.

(21) Appl. No.: 15/630,497

(22) Filed: Jun. 22, 2017

(65) Prior Publication Data

US 2018/0375487 A1    Dec. 27, 2018

(51) Int. Cl.
| | | |
|---|---|---|
| *H03H 7/20* | (2006.01) | |
| *H01P 1/18* | (2006.01) | |
| *H03H 7/32* | (2006.01) | |
| *H04L 27/233* | (2006.01) | |
| *H01P 9/00* | (2006.01) | |

(52) U.S. Cl.
CPC ............ *H03H 7/325* (2013.01); *H01P 9/006* (2013.01); *H04L 27/2331* (2013.01)

(58) Field of Classification Search
CPC ........... H03H 7/20; H03H 7/345; H01P 1/184
USPC .................................................. 333/139, 156
See application file for complete search history.

(56) References Cited

U.S. PATENT DOCUMENTS

| | | | | |
|---|---|---|---|---|
| 5,119,050 A | * | 6/1992 | Upshur ................... | H01P 1/185 333/117 |
| 6,281,838 B1 | * | 8/2001 | Hong ....................... | H01Q 3/36 333/139 |
| 6,741,207 B1 | * | 5/2004 | Allison ................... | H01P 1/184 333/164 |
| 7,315,225 B2 | * | 1/2008 | Borysenko ............. | H01P 1/185 333/139 |
| 7,355,492 B2 | * | 4/2008 | Hyman ..................... | H01P 1/18 333/139 |
| 7,570,133 B1 | * | 8/2009 | Taft .......................... | H01P 1/184 333/156 |
| 7,969,359 B2 | | 6/2011 | Krishnaswamy | |
| 2005/0040874 A1 | * | 2/2005 | Allison .................... | H01P 1/127 327/231 |
| 2006/0197567 A1 | | 9/2006 | Jakobs et al. | |
| 2015/0078217 A1 | | 3/2015 | Choi | |

(Continued)

FOREIGN PATENT DOCUMENTS

| | | |
|---|---|---|
| CN | 103997338 A | 8/2014 |
| CN | 105810239 A | 7/2016 |
| WO | 2006039093 A1 | 4/2006 |

OTHER PUBLICATIONS

Wikipedia, Varicap last edited Mar. 29, 2017 (9 pages).

(Continued)

*Primary Examiner* — Dean O Takaoka
(74) *Attorney, Agent, or Firm* — Trop Pruner & Hu, P.C.

(57) ABSTRACT

In some examples, a delay apparatus includes a controllable delay line comprising a plurality of delay elements selectively connected in a signal path to vary a delay of a signal passing through the delay line, and a controllable phase shifter comprising reflective loads adjustable to vary a phase shift applied to the signal.

19 Claims, 5 Drawing Sheets

(56) References Cited

U.S. PATENT DOCUMENTS

2015/0270821 A1  9/2015  Natarajan

OTHER PUBLICATIONS

State Intellectual Property Office of the P.R. China (ISA/CN), International Search Report and Written Opinion for PCT/CN2018/092297 dated Sep. 25, 2018 (10 pages).

* cited by examiner

METHODS AND APPARATUS OF ADJUSTING DELAYS OF SIGNALS

TECHNICAL FIELD

The invention relates generally to adjusting delays of signals using delay circuits.

BACKGROUND

Signals can be transmitted over various media (e.g., a wireless medium or a wired medium) between a transmitter and a receiver. Delay circuits for delaying signals can be added to a communication system for various purposes.

For example, adaptive communication systems can employ delay circuits. Examples of adaptive communication systems include a signal equalizer (used to compensate for distortion of a signal), a signal canceller (used to cancel one signal from another signal), an adaptive transversal signal filter (used to filter signals with variable filter coefficients), a self-interference canceller (used to cancel interference caused by transmitting and receiving signals at a same frequency or frequency band, such as for a full-duplex wireless transceiver), or other systems.

The amount of delay to use in a communication system can vary depending upon the particular condition or application. It can be challenging to provide delay circuits that can be controlled to achieve a desired wide tunable range of delays, while providing the ability to adjust signal delays incrementally at a desired delay resolution and while achieving linearity and uniform insertion loss across different delays.

SUMMARY

According to aspects of the present disclosure, a programmable delay circuit includes a coarse delay adjustment portion and a fine delay adjustment portion for varying a delay of a signal.

According to an aspect of the present disclosure, there is provided a delay apparatus that includes a controllable delay line comprising a plurality of delay elements selectively connected in a signal path to vary a delay of a signal passing through the delay line, and a controllable phase shifter comprising a reflective load adjustable to vary a phase shift applied to the signal.

According to another aspect of the present disclosure, there is provided a method of delaying a signal, the method including controlling a delay line to provide coarse adjustment of a delay of the signal, and controlling a phase shifter to provide a fine adjustment of a delay of the signal, wherein controlling the phase shifter comprises controlling a capacitance of a variable capacitive element of the phase shifter that further includes a shunt resistor connected in parallel with the variable capacitive element.

Optionally, in any of the preceding aspects, in another implementation, the controllable delay line is configured to apply a coarse delay on the signal, and the controllable phase shifter is configured to apply a fine delay on the signal.

Optionally, in any of the preceding aspects, in another implementation, the controllable delay line comprises switches, each switch controllable to selectively connect a respective delay element of the plurality of delay elements into the signal path.

Optionally, in any of the preceding aspects, in another implementation, the plurality of delay elements comprise multiple sets of delay elements, and the switches comprise multiple pairs of switches, each pair of switches associated with a respective set of delay elements of the multiple sets of delay elements.

Optionally, in any of the preceding aspects, in another implementation, each pair of switches is configured to selectively connect delay elements of the respective set of delay elements in the signal path.

Optionally, in any of the preceding aspects, in another implementation, the multiple sets of delay elements include a first set of delay elements and a second set of delay elements, and at least one delay element in the first set of delay elements provides a signal delay that is different from each delay element of the second set of delay elements.

Optionally, in any of the preceding aspects, in another implementation, the plurality of delay elements comprise delay elements that provide delays that are integer multiples of a predetermined delay resolution.

Optionally, in any of the preceding aspects, in another implementation, at least some of the delay elements comprise respective meandering transmission lines of different lengths.

Optionally, in any of the preceding aspects, in another implementation, the delay elements comprise respective transmission lines in different layers of an integrated circuit device.

Optionally, in any of the preceding aspects, in another implementation, the controllable phase shifter comprises a hybrid quadrature coupler connected to the reflective loads, and the reflective load comprises a variable capacitance element connected to a reference voltage and tunable to provide different capacitances, and a shunt resister connected to the reference voltage in parallel with the variable capacitance element.

Optionally, in any of the preceding aspects, in another implementation, the reflective load of further comprises an inductor in series with the variable capacitance element and in parallel with the shunt resistor.

Optionally, in any of the preceding aspects, in another implementation, the reflective load further comprises a tuning capacitor connected in parallel with the shunt resistor.

Optionally, in any of the preceding aspects, in another implementation, a controller is to provide control inputs to the controllable delay line and the controllable phase shifter.

Optionally, in any of the preceding aspects, in another implementation, the controllable delay line is connected upstream of the variable phase shifter in the delay apparatus.

Optionally, in any of the preceding aspects, in another implementation, the controllable delay line is connected downstream of the variable phase shifter in the delay apparatus.

Optionally, in any of the preceding aspects, in another implementation, the reflective load of the controllable phase shifter comprises a varactor, and a control input controls a reverse bias voltage of the varactor to adjust a capacitance of the varactor.

Although reference is made to various aspects or features, additional or alternative aspects or features will become apparent from the following detailed description, from the drawings, or from the claims.

BRIEF DESCRIPTION OF THE DRAWINGS

Some implementations of the present disclosure are described with respect to the following figures.

Figure 1:
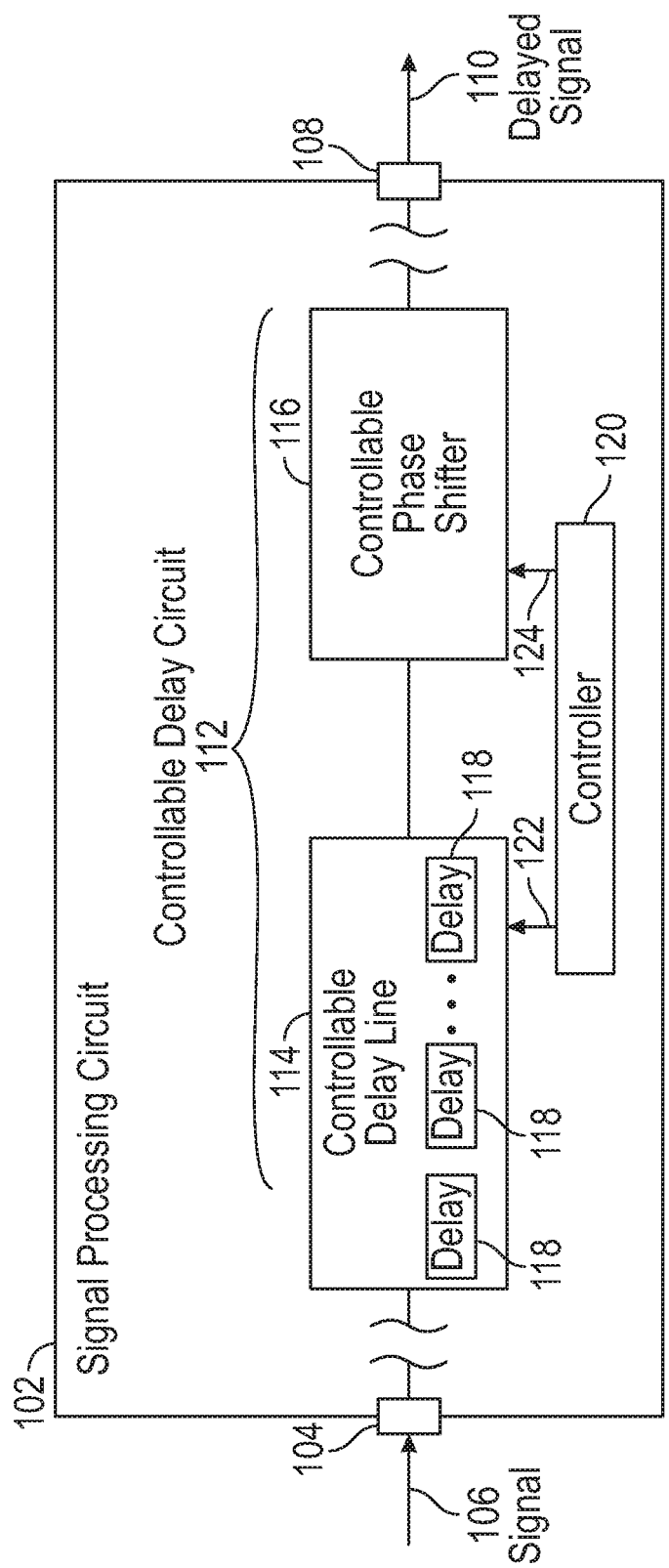
FIG. 1 is a block diagram of an example signal processing circuit according to some implementations.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the terms "a", "an", and "the" are intended to include the plural forms as well, unless the context clearly indicates otherwise. Also, the terms "includes", "including", "comprises", "comprising", "have", or "having" when used in this disclosure specify the presence of the stated elements, but do not preclude the presence or addition of other elements.

Delay circuits can be provided to cause delays of signals transmitted between different points. In some examples, delay circuits can be controlled to provide different signal delays based on a control input. As noted above, it can be challenging to provide a controllable delay circuit that has a desired wide tunable range of delays, while providing the ability to adjust signal delays incrementally at a smaller delay resolution and while achieving linearity and uniform insertion loss across different delays. The tunable range of delays refers to the range of delays that can be achieved by the controllable delay circuit. Insertion loss can refer to the loss of signal power resulting from provision of a delay circuit into a signal path. A "signal path" refers to a path over which a signal is provided from one point to another point. A delay resolution refers to an incremental delay difference that can be achieved when programming the delay circuit to increase or decrease the delay provided by the delay circuit. For example, a controllable delay circuit that can be controlled to incrementally increase or decrease delays in increments of X picoseconds (ps) is considered to have a delay resolution of X ps.

FIG. 1 is a block diagram of an example signal processing circuit 102, which includes a signal input 104 to receive a signal 106, and a signal output 108 to provide a delayed signal 110, which is a delayed version of the signal 106 received at the signal input 104. The signal processing circuit 102 can be a portion of a larger system used to propagate a signal from one point to another point, and/or to process a signal. In some examples, the signal processing circuit 102 can be part of a collection of different signal processing elements, including any or some combination of the following: a filter, a signal canceller, a signal equalizer, a signal amplifier, a transceiver (a transmitter to transmit a signal in combination with a receiver to receive a signal), and so forth.

The signal processing circuit 102 includes a controllable delay circuit 112, which has a coarse delay adjustment portion (in the form of a controllable delay line 114) to provide coarse control of signal delay, and a fine delay adjustment portion (in the form of a controllable phase shifter 116) to provide fine control of signal delay. Coarse control of signal delay refers to controlling signal delay adjustments in increments of a coarse delay resolution. Fine delay control refers to controlling delay adjustments by a delay resolution that is shorter than the coarse delay resolution.

The controllable delay line 114 includes multiple delay elements 118 that are selectively connected in a signal path to vary a delay of a signal passing through the controllable delay line 114. A delay element 118 can be implemented with a transmission line (e.g., an electrically conductive trace, a signal waveguide, etc.) of a respective length. Different delay elements can be implemented with transmission lines of different lengths to provide different signal delays.

In other examples, a delay element 118 can be implemented using a different type of circuit that causes a delay in the propagation of a signal.

Different subsets of the delay elements 118 can be selected to be connected in the signal path to provide respective different delays. The amount of delay that is set by the controllable delay line 114 can vary between a minimum signal delay and a maximum signal delay, in increments of X ps (the delay resolution).

In some examples (as discussed further below in connection with FIG. 2), the selected delay elements can be connected by the use of switches in the delay line 114. The switches are digitally controllable to selectively connect delay elements of the multiple delay elements 118 in a signal path.

The controllable phase shifter 116 can include a controllable reflective-load phase shifter, which includes a hybrid coupler and reflective loads whose impedance can be adjusted to reflect a signal. The reflective loads are adjustable to vary a phase shift applied to the signal 106 propagated through the controllable delay circuit 112. The phase shift of the signal causes a delay to be applied to the signal.

FIG. 1 also shows a controller 120 that controls the amount of delay applied by the controllable delay line 114 and the amount of phase shift applied by the phase shifter 116. The controller 120 can be implemented as a hardware processing circuit, such as a microprocessor, a core of a multi-core microprocessor, a microcontroller, a programmable integrated circuit device, a programmable gate array, or any other type of hardware processing circuit. Alternatively, the controller 120 can be implemented as a combination of a hardware processing circuit and machine-readable instructions (e.g., software or firmware) executable on the hardware processing circuit.

The controller 120 generates a coarse control input 122 that selects which of the delay elements 118 of the controllable delay line 114 are connected into the signal path. For example, the coarse control input 122 includes one or more control signals that control respective switches of the controllable delay line 114 to connect a first subset of the delay elements 118 in the signal path (and to maintain a second subset of the delay elements 118 out of the signal path).

The controller 120 generates a fine control input 124 that controls an amount of a phase shift applied by the controllable phase shifter 116. The fine control input 124 can adjust the impedance of the reflective loads of the controllable phase shifter 116 to cause a change in the phase shift applied by the controllable phase shifter 116. In some examples, the fine control input 124 can be in the form of a DC voltage, which can be varied to cause the impedance of the reflective loads of the controllable phase shifter 116 to change (discussed further below in connection with FIG. 5).

Although FIG. 1 shows the controller 120 as being part of the signal processing circuit 102, it is noted that the controller 120 can be separate from the signal processing circuit 102. In general, the controller 120 is able to control signal delays of multiple controllable delay circuits 112 in one or more signal processing circuits.

In the example of FIG. 1, the controllable delay line 114 is provided upstream of the controllable phase shifter 116. In such an arrangement, the signal 106 is first delayed by the controllable delay line 114, and the delayed version of the signal is then provided from the controllable delay line 114 to the controllable phase shifter 116, which adjusts a phase of the delayed signal from the delay line 114. The output of the controllable phase shifter 116 corresponds to the delayed signal 110.

In alternative examples, the order of the controllable delay line 114 and the controllable phase shifter 116 is reversed. In these alternative examples, the controllable delay line 114 is provided downstream of the controllable phase shifter 116 in the signal processing circuit 102. In such alternative examples, the signal 106 is first passed through the phase shifter 116, and the phase shifted signal is then passed through the controllable delay line 114 and is output as the delayed signal 110.

It is noted that there can be additional circuitry (not shown) between the signal input 104 and the controllable delay circuit 112, and additional circuitry (not shown) between the controllable delay circuit 112 and the signal output 108.

Figure 2:
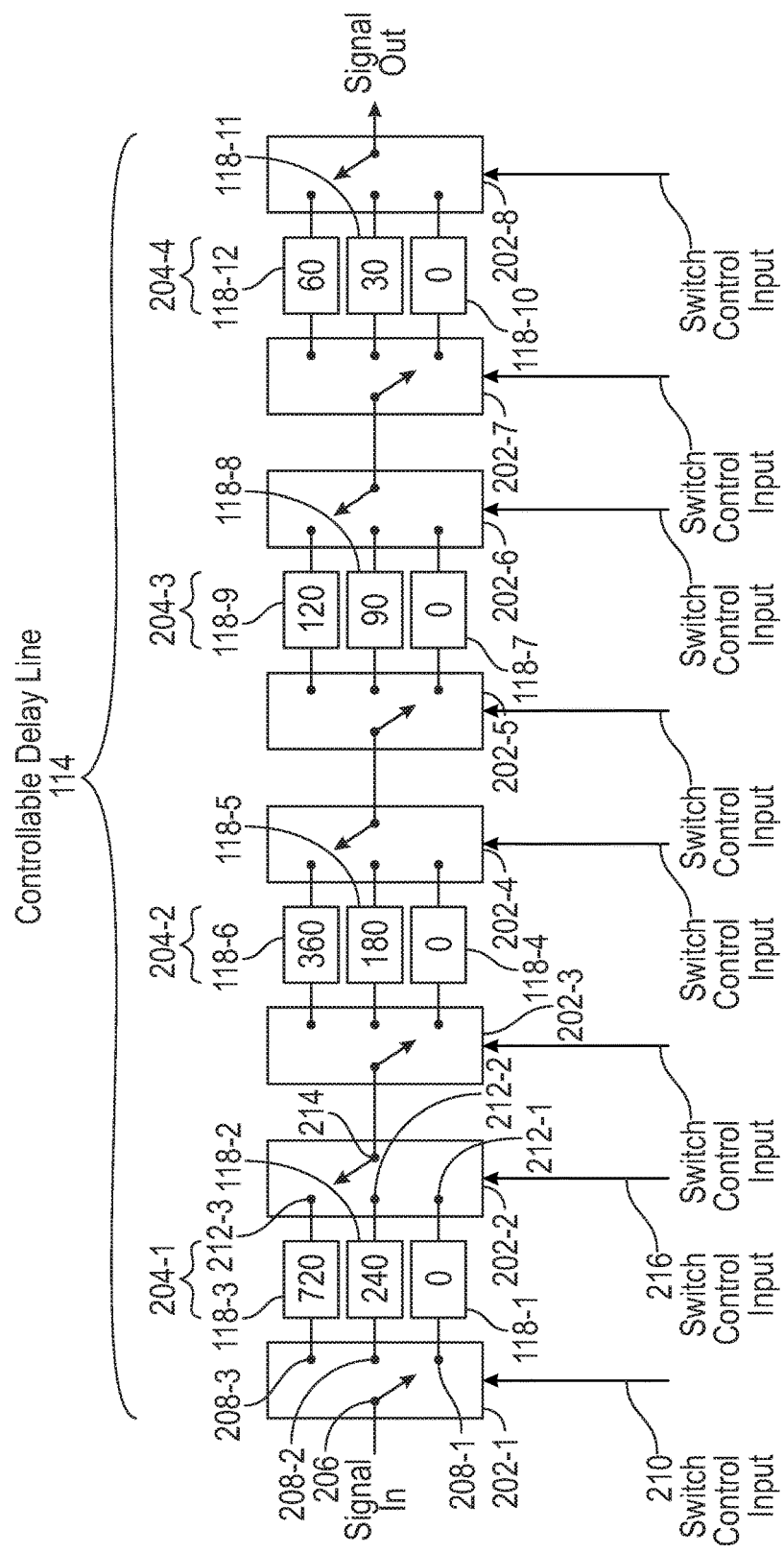
FIG. 2 is a block diagram of a controllable delay line to provide coarse adjustment of signal delays, according to some implementations.

FIG. 2 is a schematic diagram of components of the controllable delay line 114 that receives an input signal at "Signal In," and outputs a delayed signal at "Signal Out," according to some examples of the present disclosure. The controllable delay line 114 includes delay elements 118-1 to 118-12 (12 delay elements in the example). Each delay element has a number shown in FIG. 2, which represents the signal delay provided by the delay element if the delay element is connected into a signal path through the controllable delay line 114. For example, a value of "720" shown for the delay element 118-3 indicates that the delay element 118-3 causes a signal delay of 720 ps if the delay element 118-3 is connected into the signal path. Other delay elements can provide other non-zero delays. A value of "0" shown for each of the delay elements 118-1, 118-4, 118-7, and 118-10 indicates that the delay element 118-1, 118-4, 118-7, or 118-10 causes a signal delay of 0 ps if the delay element is connected into the signal path.

Although a specific arrangement of components and values of delay elements is shown in FIG. 2, it is noted that in other examples, other arrangements of components and values of delay elements can be used in the controllable delay line 114.

The controllable delay line 114 further includes a number of switches 202-1, 202-2, 202-3, 202-4, 202-5, 202-6, 202-7, and 202-8 (8 switches in the example). The switches 202-1 to 202-8 are used to selectively control which of the delay elements 118-1 to 118-12 are connected in a signal path through the controllable delay line 114.

In the example arrangement of FIG. 2, multiple sets of delay elements are provided. The multiple sets of delay elements include a first set 204-1 of delay elements (118-1, 118-2, and 118-3), a second set 204-2 of delay elements (118-4, 118-5, and 118-6), a third set 204-3 of delay elements (118-7, 118-8, and 118-9), and a fourth set 204-4 of delay elements (118-10, 118-11, and 118-12). Each set of delay elements is associated with a pair of switches. For example, the set 204-1 of delay elements is associated with a first pair of switches 202-1 and 202-2, the set 204-2 of delay elements is associated with second pair of switches 202-3 and 202-4, the set 204-3 of switches is associated with a third pair of switches 202-5 and 202-6, and the set 204-4 of switches is associated with a fourth pair of switches 202-7 and 202-8.

The switch 202-1 has an input port 206, which can be selectively connected to any of three output ports 208-1, 208-2, and 208-3, in response to a switch control input 210. The switch control input 210 can be set to one of three possible values to set the switch 202-1 to one of three possible positions. In a first position of the switch 202-1, the input port 206 is connected to the output port 208-1, in a second position of the switch 202-1, the input port 206 is connected to the output port 208-2, and in a third position of the switch 202-1, the input port 206 is connected to the output port 208-3). The output ports 208-1 to 208-3 of the switch 202-1 are connected to respective delay elements 118-1 to 118-3 of the set 204-1 of delay elements.

The switch 202-2 has three input ports 212-1, 212-2, and 212-3 that are connected to the respective delay elements 118-1, 118-2, and 118-3 of the set 204-1. The switch 202-2 has an output port 214 that can be selectively connected to any of the three input ports 212-1, 212-2, and 212-3 in response to a switch control input 216 (which can be provided by the controller 120). The switch control input 216 can be set to one of three possible values to set the switch 202-2 to one of three possible positions.

Each of the switches 202-3, 202-5, and 202-7 are configured in similar fashion as the switch 202-1, and each of the switches 202-4, 202-6, and 202-8 are configured in similar fashion as the switch 202-2. The switch control inputs to the switches 202-1 to 202-8 are provided by the controller 120 of FIG. 1.

In the example of FIG. 2, each set of delay elements includes a delay element that provides a unique signal delay different from signal delays provided by all delay elements of all other sets of delay elements. For example, in the set 204-1, delay elements 118-2 and 118-3 provide unique signal delays (240 ps and 720 ps, respectively) different than signal delays provided by all the delay elements of all the other sets 204-2, 204-3, and 204-4. Similarly, delay elements 118-8 and 118-9 of the set 204-3 provide unique signal delays that are different from signal delays provided by all delay elements of all the other sets 204-1, 204-2, and 204-4.

Using the example arrangement of FIG. 2, a delay resolution of 30 ps can be achieved. The controllable delay line 114 can vary a delay from 0 picoseconds to up to 1,250 picoseconds, in increments of 30 picoseconds. Note that the ability to achieve the delay resolution of 30 picoseconds in the example of FIG. 2 is achieved by using delay elements that are integer multiples of the delay resolution.

More generally, there can be $N_d$ delay elements connected to $N_s$ switch pairs. In the example of FIG. 2, $N_d=12$, and $N_s=4$. In other examples, a different number of delay elements and different number of switch pairs can be employed. The delay elements can provide different delay amounts to achieve a delay resolution of X ps.

Figure 3:
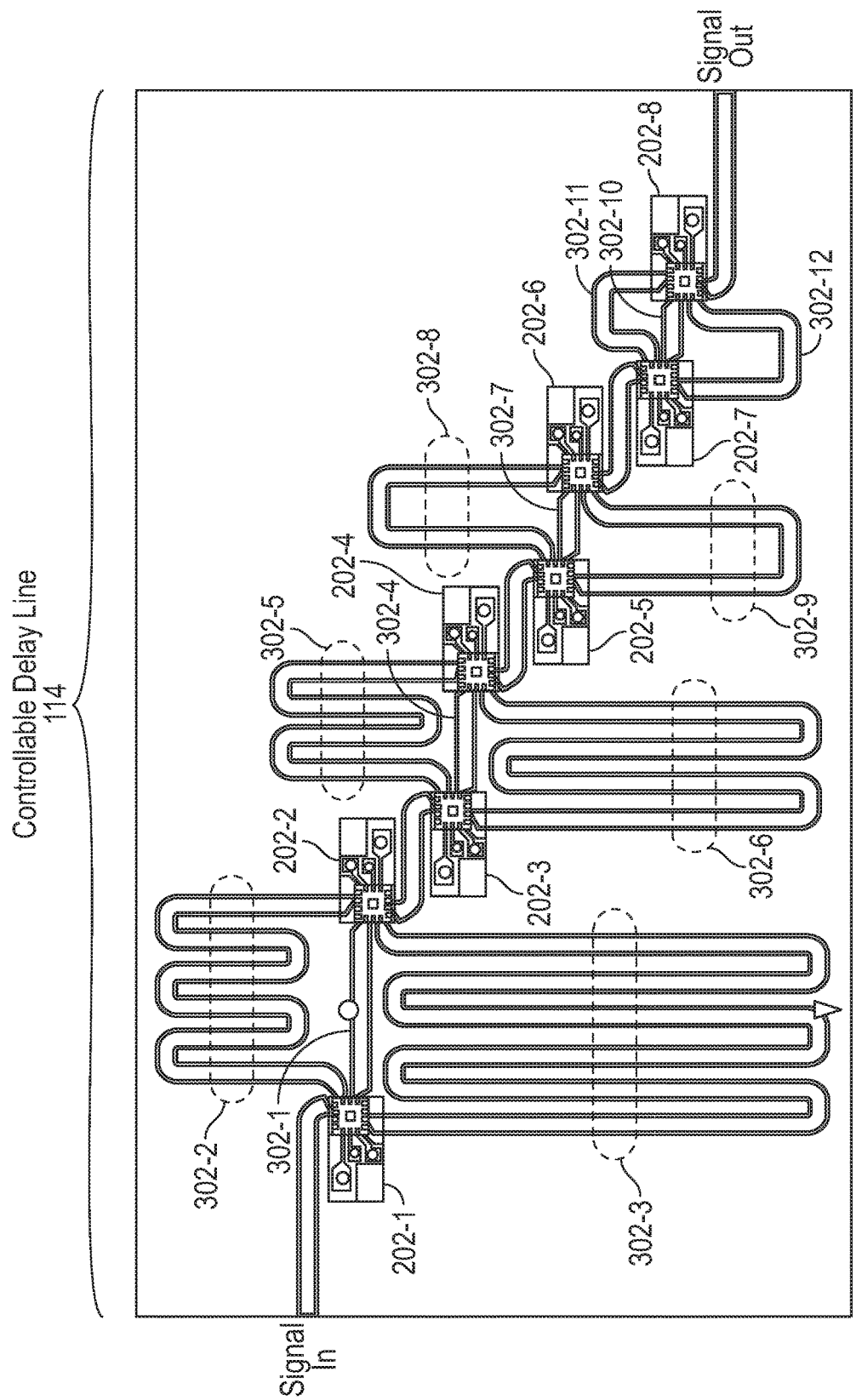
FIGS. 3 and 4 illustrate different implementations of the controllable delay line of FIG. 2, according to various implementations.

FIG. 3 shows an example of implementing the controllable delay line 114 of FIG. 2 using some delay elements implemented with meandering transmission lines in a single layer of an integrated circuit (IC) device. A meandering transmission line has a serpentine pattern to achieve a transmission line of a target length. In the example of FIG. 3, the delay element 118-1 (FIG. 2) is implemented with a transmission line 302-1 of a first length, the delay element 118-2 is implemented with a meandering transmission line 302-2 of a second length, and the delay element 118-3 is implemented with a meandering transmission line 302-3 of a third length. The third length is larger than the second length, and the second length is larger than the first length.

Similarly, delay elements 118-4, 118-5, and 118-6 are implemented with respective transmission lines 302-4, 302-5, and 302-6; delay elements 118-7, 118-8, and 118-9 are implemented with respective transmission lines 302-7, 302-8, and 302-9; and delay elements 118-10, 118-11, and 118-12 are implemented with respective transmission lines 302-10, 302-11, and 302-12.

Switches 202-1 to 202-8 can also be implemented using transistors in the layer of the IC device shown in FIG. 3.

Figure 4:
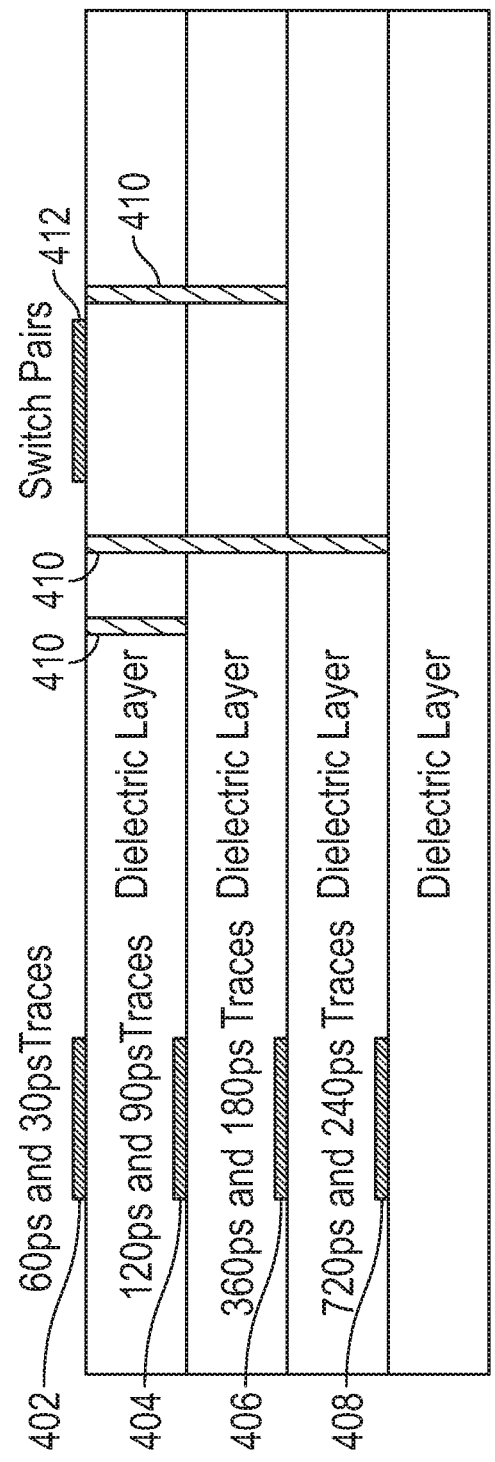

FIG. 4 is a cross-sectional view of another implementation, in which delay elements of the controllable delay line 114 are provided in multiple layers of an IC device. In FIG. 4, the delay elements 118-11 and 118-12 can be implemented using signal traces 402 in a first layer, the delay elements 118-8 and 118-9 can be implemented using signal traces 404 in a second layer, the delay elements 118-5 and 118-6 can be implemented using signal traces 406 in a third layer, and the delay elements 118-2 and 118-3 can be implemented using signal traces 408 in a fourth layer. Dielectric layers are provided between successive signal trace layers. Vias 410 are used to connect the signal traces to switch pairs 412 (shown as being part of the first layer in FIG. 4). The switch pairs include the switches 202-1 to 202-8 of FIG. 2.

Using either the arrangement of FIG. 3 or 4, the controllable delay line 114 can be implemented with a smaller footprint to provide a delay circuit of a size smaller than a size of a delay circuit in which meandering transmission lines are not used or a size of a delay circuit in which signal traces in different layers are not used.

Figure 5:
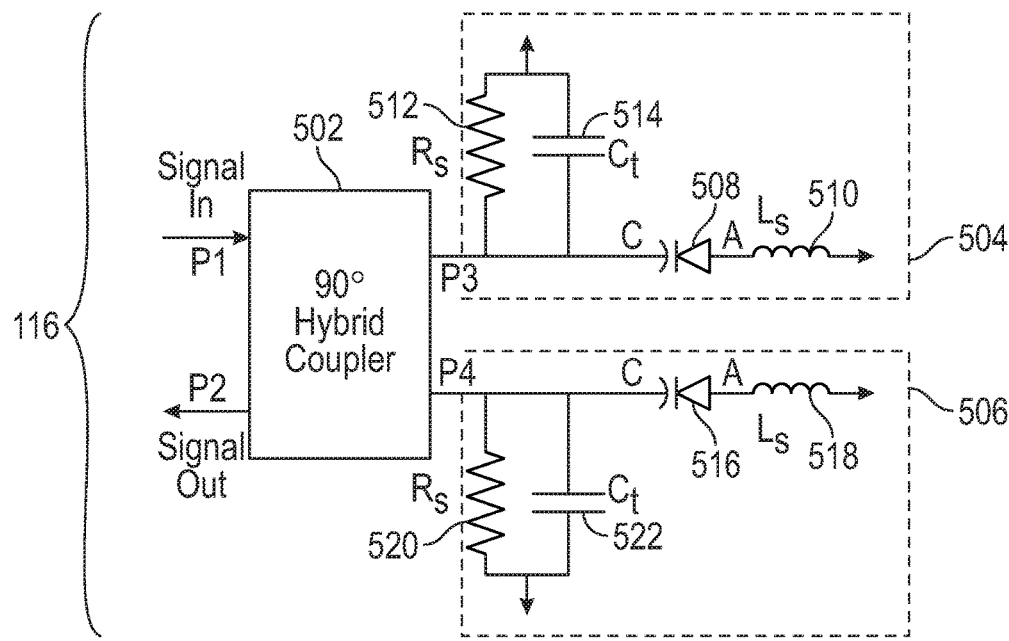
FIG. 5 is a schematic diagram of a variable reflective-load phase shifter, according to further implementations.

FIG. 5 shows an example of a controllable phase shifter 116 according to some implementations. The phase shifter 116 includes a 90° hybrid quadrature coupler 502 that has four ports connected respectively to a signal input P1, a signal output P2, and nodes P3 and P4. The nodes P3 and P4 are connected to respective identical reflective loads 504 and 506. The reflective loads 504 and 506 are "identical" in the sense that the reflective loads 504 and 506 include components and arrangements that are intended to be the same, but which may differ due to manufacturing tolerances of a manufacturing process used to make the reflective loads 504 and 506.

The reflective load 504 includes a varactor 508 and an inductor 510 in series with the varactor 508. A varactor is a diode (referred to as a "varicap diode") that is to be operated in a reverse-biased configuration. The varactor has a capacitance that varies with the reverse bias voltage applied to the varactor. The varactor 508 has a cathode (C) and an anode (A). The varactor 508 is reverse biased if the voltage at the cathode (C) is higher than the voltage at the anode (A) of the varactor by a specified amount. In other examples, instead of using the varactor 508, another circuit element with a variable capacitance can be used.

The series arrangement of the varactor 508 and inductor 510 is connected between node P3 and a reference voltage (e.g., ground). The inductor 510 is provided to increase the range of phase shift that can be applied by the controllable phase shifter 116.

In addition, the reflective load 504 includes a shunt resistor 512 and a tuning capacitor 514. The shunt resistor 512 is connected between a node (P3) of the varactor 512 and the reference voltage (e.g., ground). The tuning capacitor 514 is connected in parallel with the shunt resistor 512 between node P3 and the reference voltage.

The reflective load 506 has the same arrangement as the reflective load 504. The reflective load 506 includes a varactor 516 and inductor 518 arranged in series between node P4 and the reference voltage. In addition, a shunt resistor 520 and a tuning capacitor 522 are connected in parallel between node P4 and the reference voltage.

The 90° hybrid quadrature coupler 502 divides the input signal (at signal input P1) evenly but 90° out of phase onto nodes P3 and P4. In other words, half the input signal is provided onto node P3, and the other half of the input signal (90° out of phase) is provided onto node P4.

The controllable phase shifter 116 is to apply a phase shift to the input signal at signal input P1 that is based on the impedance of the reflective loads 504 and 506. More specifically, a reverse bias voltage can be applied across each of the varactors 508 and 516, to set the capacitance of each of the varactors 508 and 516. The reverse bias voltage can be applied by the controller 120 of FIG. 1.

At node P3, the signal is reflected to signal input P1 with $\varphi$ phase shift, and to signal output P2 with 90°+$\varphi$ phase shift. The $\varphi$ phase shift depends on the capacitance of the varactor 508 and the inductance of the inductor 510, in combination with the shunt resistor 512 and the tuning capacitor 514.

At P4, the signal is reflected back to signal input P1 with 180°+$\varphi$ phase shift, and back to signal output P2 with 90°+$\varphi$ phase shift. As a result, the reflected signals are combined destructively at signal input P1 (i.e., the reflected signals from nodes P3 and P4 cancel each other out because they are 180° out of phase), and combined constructively at signal output P2 (i.e., the reflected signals are added to each other because they are in phase).

Effectively, the controllable phase shifter 116 applies a 90°+$\varphi$ phase shift to the input signal at signal input P1, and outputs the phase shifted signal at signal output P2.

Whenever a circuit (such as the controllable phase shifter 116) is inserted into a signal path, insertion loss (loss of signal power due to the inserted circuit) can occur. Insertion loss can vary for different amounts of phase shift applied due to variations in the parasitic resistance of the tunable varactor 508 or 516. A change in the resistance of the varactor 508 or 516 will cause a change in signal amplitude reflected by the reflective load 504 or 506, which corresponds to a change in insertion loss. In accordance with some implementations of the present disclosure, the shunt resistor 512 or 520 compensates for variation of insertion loss for different phase shifts in each reflective load 504 or 506. A "shunt" resistor refers to a resistor that is arranged in parallel with the varactor 508 or 516 between node P3 or P4 and the reference voltage. The shunt resistor 512 or 520 is also in parallel with the inductor 510 or 518 between node P3 or P4 and the reference voltage. By providing the shunt resistor 512 or 520, the effect of the variation of the resistance of the varactor 508 or 516 is reduced, and thus fluctuation in insertion loss due to a change in the reverse bias voltage applied to the varactor 508 or 516 is reduced.

The tuning capacitor 514 or 522 is arranged in parallel with the capacitance of the varactor 508 and 516; as a result, the overall capacitance of the reflective load 504 or 506 is based on a sum of the capacitance of the tuning capacitor 514 or 522 and the capacitance of the varactor 508 and 516. The value of the tuning capacitor 514 or 522 is set to cause the controllable phase shifter 116 to operate in a region of increased linearity responsive to a possible range of reverse bias voltage of the varactor 508 or 516.

Figure 6:
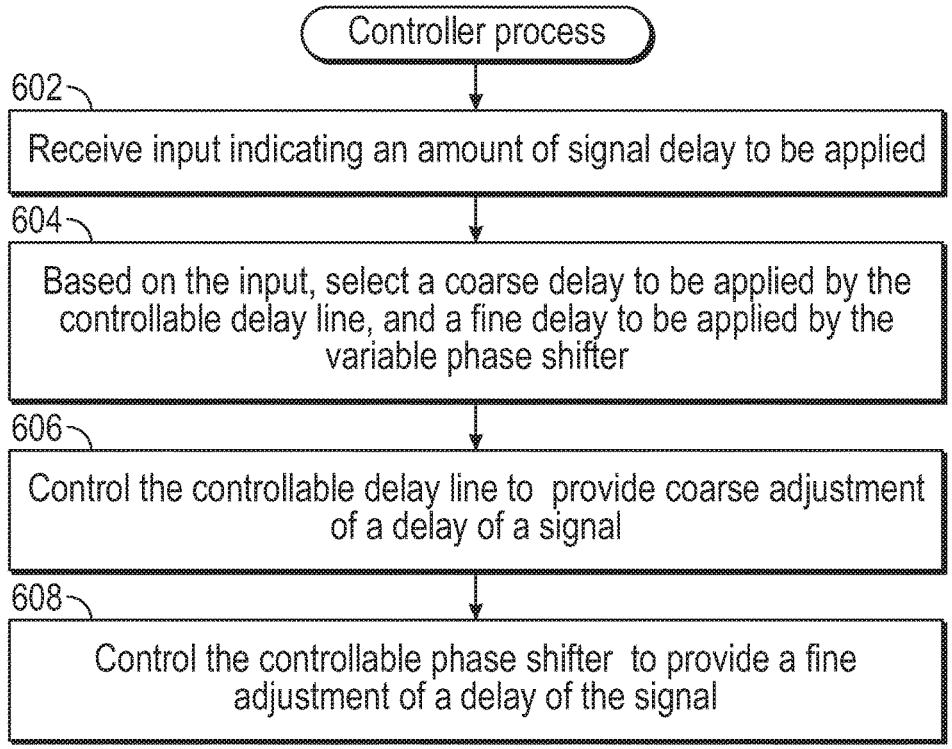
FIG. 6 is a flow diagram of an example process of a controller according to some implementations.

FIG. 6 is a flow diagram of an example process of the controller 120 of FIG. 1. The controller 120 receives (at 602) an input indicating an amount of signal delay to be applied. The input can be provided by an adaptive system in which the controllable delay circuit 112 is included.

Based on the input, the controller 120 selects (at 604) a coarse delay to be applied by the controllable delay line 114, and a fine delay to be applied by the controllable phase shifter 116.

The controller 120 controls (at 606) the controllable delay line 114 to provide a coarse adjustment of a delay of a signal, and controls (at 608) the controllable phase shifter 116 to provide a fine adjustment of a delay of the signal. Controlling the controllable delay line 114 includes activating selected switches (e.g., 202-1 to 202-8 of FIG. 2) to select which delay elements are connected in a signal path. Controlling the controllable phase shifter 116 includes controlling the capacitance of the varactors (e.g., 508 and 516 of FIG. 5) of the controllable phase shifter 116.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A delay apparatus comprising:
a controllable delay line comprising a plurality of delay elements selectively connected in a signal path to vary a delay of a signal passing through the controllable delay line; and
a controllable phase shifter comprising a reflective load adjustable to vary a phase shift applied to the signal, wherein the reflective load comprises:
a variable capacitance element connected to a reference voltage and tunable to provide different capacitances,
a shunt resistor connected to the reference voltage in parallel with the variable capacitance element, and
a tuning capacitor connected in parallel with the shunt resistor and the variable capacitance element, wherein a capacitance of the reflective load is based on a sum of a capacitance of the tuning capacitor and a capacitance of the variable capacitive element.

2. The delay apparatus of claim 1, wherein the controllable delay line is configured to apply a coarse delay on the signal, and the controllable phase shifter is configured to apply a fine delay on the signal.

3. The delay apparatus of claim 1, wherein the plurality of delay elements comprise delay elements that provide delays that are integer multiples of a predetermined delay resolution.

4. The delay apparatus of claim 1, wherein at least some of the delay elements comprise respective meandering transmission lines of different lengths.

5. The delay apparatus of claim 1, wherein the delay elements comprise respective transmission lines in different layers of an integrated circuit device.

6. The delay apparatus of claim 1, wherein the controllable phase shifter comprises a hybrid quadrature coupler connected to the reflective load.

7. The delay apparatus of claim 6, wherein the reflective load further comprises:
an inductor in series with the variable capacitance element and in parallel with the shunt resistor.

8. The delay apparatus of claim 6, wherein the variable capacitance element comprises a varactor.

9. The delay apparatus of claim 1, further comprising:
a controller to provide control inputs to the controllable delay line and the controllable phase shifter.

10. The delay apparatus of claim 9, wherein the controllable delay line comprises switches that are controllable to selectively connect delay elements of the plurality of delay elements into the signal path, and wherein a first control input of the control inputs controls activation of the switches.

11. The delay apparatus of claim 10, wherein the variable capacitive element comprises a varactor, and a second control input of the control inputs controls a reverse bias voltage of the varactor to adjust a capacitance of the varactor.

12. The delay apparatus of claim 1, wherein the controllable delay line is connected upstream or downstream of the controllable phase shifter in the delay apparatus.

13. The delay apparatus of claim 1, wherein the controllable delay line comprises:
multiple sets of delay elements, each set of the multiple sets comprising multiple delay elements, and the multiple sets of delay elements arranged in series, and
a plurality of switches to selectively select a respective delay element from each set of the multiple sets, the selected respective delay elements from the multiple sets of delay elements connected in series.

14. A delay apparatus comprising:
a controllable delay line comprising a plurality of delay elements selectively connected in a signal path to vary a delay of a signal passing through the controllable delay line, wherein the controllable delay line comprises:
multiple sets of delay elements, each set of the multiple sets comprising multiple delay elements, and the multiple sets of delay elements arranged in series, and
a plurality of switches to selectively select a respective delay element from each set of the multiple sets, the selected respective delay elements from the multiple sets of delay elements connected in series; and
a controllable phase shifter comprising a reflective load adjustable to vary a phase shift applied to the signal.

15. The delay apparatus of claim 14, wherein the plurality of switches comprise multiple pairs of switches, each pair of switches associated with a respective set of the multiple sets of delay elements, and wherein each pair of switches is configured to selectively connect delay elements of the respective set of delay elements in the signal path.

16. The delay apparatus of claim 15, wherein the multiple sets of delay elements include a first set of delay elements, and wherein at least one delay element in the first set of delay elements provides a unique signal delay that is different from signal delays provided by all delay elements of all other sets of delay elements.

17. The delay apparatus of claim 14, wherein the controllable phase shifter comprises a hybrid quadrature coupler connected to the reflective load, and the reflective load comprises:
a varactor tunable to provide different capacitances,
a shunt resistor connected in parallel with the varactor between a node and a reference voltage, and
a tunable capacitor connected in parallel with the shunt resistor and the varactor between the node and the reference voltage, wherein a capacitance of the reflective load is based on a sum of a capacitance of the tunable capacitor and a capacitance of the varactor.

18. A method of delaying a signal, comprising:
controlling a delay line to provide coarse adjustment of a delay of the signal, wherein the delay line comprises:
multiple sets of delay elements, each set of the multiple sets comprising multiple delay elements, and the multiple sets of delay elements arranged in series, and
a plurality of switches to selectively select a respective delay element from each set of the multiple sets, the selected respective delay elements from the multiple sets of delay elements connected in series, wherein controlling the delay line comprises controlling the plurality of switches; and
controlling a phase shifter to provide a fine adjustment of a delay of the signal, wherein controlling the phase shifter comprises controlling a capacitance of a variable capacitive element of the phase shifter that further includes a shunt resistor connected in parallel with the variable capacitive element.

19. The method of claim 18, wherein the phase shifter comprises a reflective load adjustable to vary a phase shift of the signal, wherein the reflective load comprises:
a variable capacitance element tunable to provide different capacitances and connected between a node and a reference voltage,
a shunt resistor connected between the node and the reference voltage in parallel with the variable capacitance element, and
a tuning capacitor connected between the node and the reference voltage in parallel with the shunt resistor and the variable capacitance element, wherein a capacitance of the reflective load is based on a sum of a capacitance of the tuning capacitor and a capacitance of the variable capacitive element,
wherein controlling the delay line comprises controlling the variable capacitance element.

* * * * *